(12) United States Patent
Kang

(10) Patent No.: US 12,191,232 B2
(45) Date of Patent: Jan. 7, 2025

(54) DATA STORAGE STRUCTURE OR DATA INFRASTRUCTURE INCLUDING A PLURALITY OF STORAGE DEVICE PRELIMINARY CLASS

(71) Applicant: SK hynix Inc., Icheon-si (KR)

(72) Inventor: Ho Sung Kang, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 210 days.

(21) Appl. No.: 18/069,292

(22) Filed: Dec. 21, 2022

(65) Prior Publication Data

US 2024/0071867 A1 Feb. 29, 2024

(30) Foreign Application Priority Data

Aug. 31, 2022 (KR) .................. 10-2022-0109627

(51) Int. Cl.
| | |
|---|---|
| H05K 7/20 | (2006.01) |
| H01L 23/467 | (2006.01) |
| H10B 80/00 | (2023.01) |

(52) U.S. Cl.
CPC ....... H01L 23/467 (2013.01); H05K 7/20127 (2013.01); H05K 7/20745 (2013.01); H05K 7/20836 (2013.01); H10B 80/00 (2023.02)

(58) Field of Classification Search
CPC ........... H05K 7/20127; H05K 7/20745; H05K 7/20836; H01L 23/467
See application file for complete search history.

(56) References Cited

U.S. PATENT DOCUMENTS

| | | | |
|---|---|---|---|
| 5,239,037 A | 8/1993 | Krishnan | |
| 6,327,144 B1 * | 12/2001 | May ...................... | H01H 13/86 174/15.2 |
| 9,648,730 B2 | 5/2017 | Harvilchuck | |
| 9,958,914 B2 * | 5/2018 | Kim .......................... | G06F 1/20 |
| 2004/0090746 A1* | 5/2004 | Reisacher ............. | H01L 23/473 257/E23.098 |
| 2011/0242746 A1* | 10/2011 | Hoffman ............ | H05K 7/20009 29/829 |

FOREIGN PATENT DOCUMENTS

| | | |
|---|---|---|
| JP | 2015-122360 A | 7/2015 |
| JP | 6233377 B2 | 3/2016 |
| KR | 10-2014-0004864 A | 1/2014 |
| KR | 10-2018-0031968 A | 3/2018 |
| KR | 10-2020-0004663 A | 1/2020 |

OTHER PUBLICATIONS

"Breathable polyurethane membranes for textile and related industries" by George Robert Lomax, Accepted May 8, 2007 First published as an Advance Article on the web May 22, 2007 DOI: 10.1039/b703447b.

* cited by examiner

*Primary Examiner* — Mukundbhai G Patel

(57) ABSTRACT

A storage device includes a printed circuit board (PCB) with attached semiconductor chips, each including a memory, and with at least one wire coupling the plural semiconductor chips, and a breathable case surrounding a top portion and a bottom portion of the printed circuit board. The breathable case includes a first layer disposed on a second layer which is exposed to the printed circuit board. The second layer has smaller pores than the first layer.

20 Claims, 7 Drawing Sheets

DATA STORAGE STRUCTURE OR DATA INFRASTRUCTURE INCLUDING A PLURALITY OF STORAGE DEVICE PRELIMINARY CLASS

CROSS-REFERENCE TO RELATED APPLICATIONS

This patent application claims the benefit of priority under 35 U.S.C. § 119(a) to Korean Patent Application No. 10-2022-0109627, filed on Aug. 31, 2022 in the Korean Intellectual Property Office, the entire disclosure of which is incorporated herein by reference.

TECHNICAL FIELD

One or more embodiments of the present disclosure described herein relate to a storage, and more particularly to a case, for use with a memory device or a data storage device.

BACKGROUND

In a computing system, the amount of computation needed is increasing in response to user's needs. Due to the increase in the amount of computation, the amount of data generated or stored in the computing system is also increasing. To support an increased amount of computation and to store the large amount of generated data, a data storage structure or a data infrastructure including a plurality of storage devices has been used. The data storage structure or the data infrastructure may also be understood as a data center or a data server. The data storage structure or the data infrastructure may have a plurality of storage devices that are integrated in order to install more storage devices in a limited space.

BRIEF DESCRIPTION OF THE DRAWINGS

The description herein makes reference to the accompanying drawings wherein like reference numerals refer to like parts throughout the figures.

DETAILED DESCRIPTION

Figure 1:
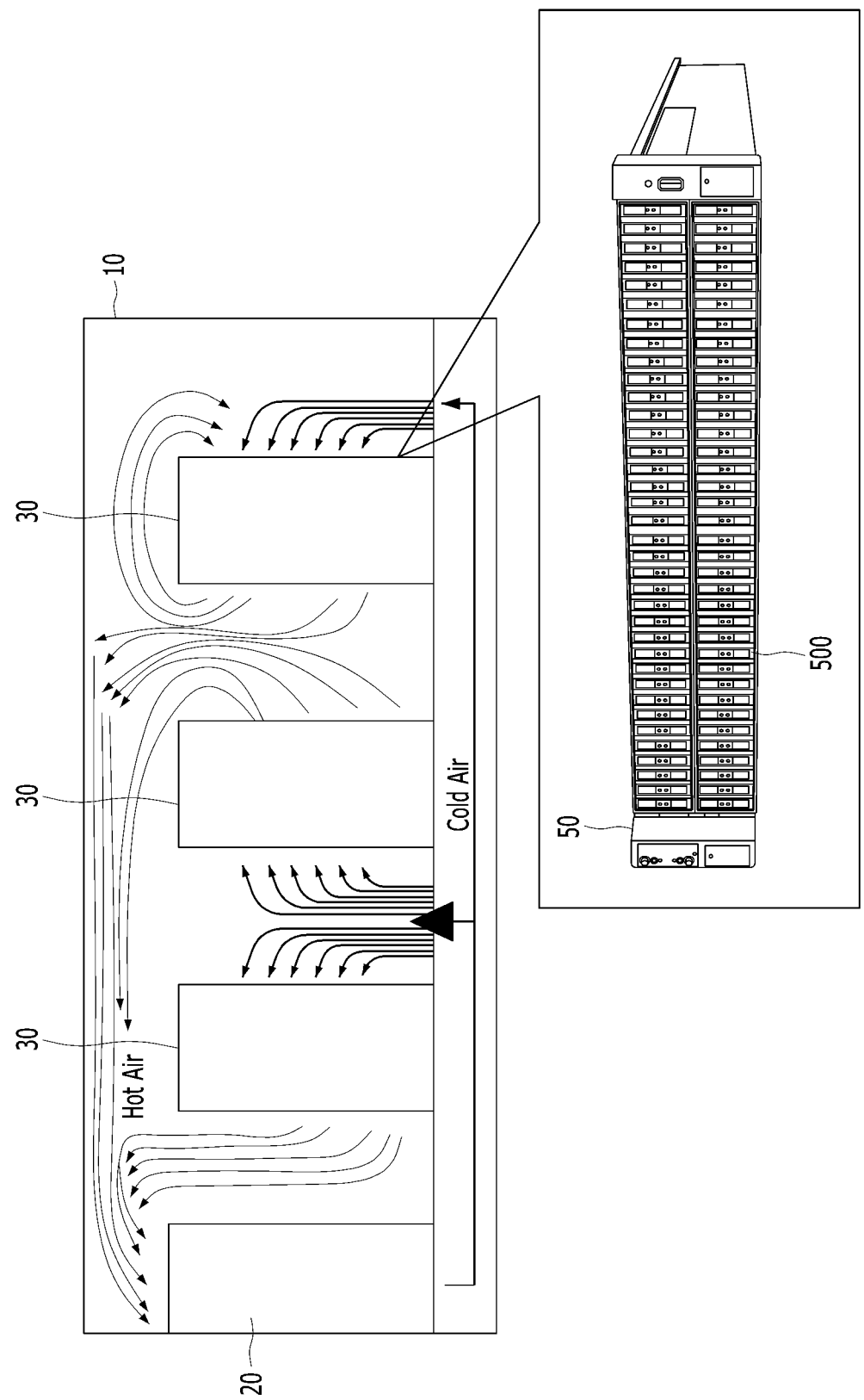
FIG. 1 illustrates an example of a data infrastructure according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language include hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used herein, the terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Embodiments described herein provide an apparatus and a method capable of maintaining the performance of a memory device or a data storage device included in a data storage structure or a data infrastructure.

In an embodiment, a storage device can include a printed circuit board (PCB) with attached semiconductor chips, each including a memory, and with at least one wire coupling the semiconductor chips; and a breathable case surrounding a top portion and a bottom portion of the printed circuit board and comprising a first layer disposed on a second layer, which is exposed to the printed circuit board, wherein the second layer has smaller pores than the first layer.

The first layer can include at least one of a poly-urethane membrane layer or a graphene layer. The second layer can include at least one of graphite-fabric membrane layer, a carbon fabric layer, an aramid fabric layer, or a glass fabric layer.

The breathable case can be divided into a first part, comprising a first layer and a second layer, configured to cover the top portion of the printed circuit board; and a second part, comprising a first layer and a second layer, configured to cover the bottom portion of the printed circuit board. The first part and the second part can be detached from each other.

The printed circuit board can include a protrusion portion including at least one pin configured to be coupled to a socket of an external apparatus. The breathable case can include an opening configured to expose the protrusion portion to the outside.

The semiconductor chips attached on the printed circuit board are not in contact with the breathable case. Instead, an air gap is arranged between the semiconductor chips and the breathable case. Any pad or component to deliver a heat does not exist between the plural semiconductor chips and the breathable case.

The first layer can comprise a hydrophobic material and have a porous membrane structure. The second layer can comprise a fabric material and have a porous membrane structure.

The second layer can have a greater thermal conductivity than elemental aluminum.

The surface of the semiconductor chips is cooled by air flowing from an inside of the breathable case to an outside of the breathable case. The surface temperature of the plurality of semiconductor chips may be cooled below 70° C., in particular when the surface temperature rises to 80-100° C. due to internal heating.

A thermal flash point of the first layer and the second layer can be 100° C. or more.

In another embodiment, a data infrastructure can include a plurality of storage devices, each storage device comprising a breathable case that surrounds a top portion and a bottom portion of a printed circuit board on which a plurality semiconductor chips are attached and that comprises a first layer exposed to an outside and a second layer exposed to the printed circuit board, wherein the second layer has smaller pores than the first layer; and a rack configured to arrange the plurality of storage devices in a row direction, a column direction, or a row and column direction.

The data infrastructure can further include a temperature sensor configured to measure and monitor an internal temperature of the data infrastructure; and an air conditioning unit configured to control an air flow to maintain the internal temperature in a range of 10° C. to 35° C. (Celsius).

The first layer can include at least one of a poly-urethane membrane layer or a graphene layer. The second layer can include at least one of graphite-fabric membrane layer, a carbon fabric layer, an aramid fabric layer, or a glass fabric layer.

The breathable case can be divided into a first part, comprising a first layer and a second layer, configured to cover the top portion of the printed circuit board; and a second part, comprising a first layer and a second layer, configured to cover the bottom portion of the printed circuit board. The first part and the second part can be detachable from each other.

The rack can include a plurality of sockets. The printed circuit board can include a protrusion portion including at least one pin configured to be coupled to one of the plurality of sockets in the rack. The breathable case can include an opening configured to expose the protrusion portion to the outside.

The plurality of semiconductor chips attached on the printed circuit board are not in contact with the breathable case. Instead, the semiconductor chips and the breathable case may be separated by an air gap. Any pad or component to deliver a heat does not exist between the plural semiconductor chips and the breathable case.

The first layer can comprise a hydrophobic material and have a porous membrane structure. The second layer can comprise a fabric material and have a porous membrane structure.

Embodiments will now be described with reference to the accompanying drawings, wherein like numbers reference like elements.

FIG. 1 illustrates an example of a data infrastructure according to an embodiment of the present disclosure.

Specifically, FIG. 1 illustrates a data center 10 as a first example of a data infrastructure. The data center 10 can include a plurality of towers 30 and an air conditioner 20 capable of controlling an internal temperature of the data center 10. The plurality of towers 30 can each include a computing system, and each computing system can include a plurality of storage devices 500 and at least one rack 50 capable of arranging the plurality of storage devices 500 in a row direction, a column direction, or a row and column direction. The rack 50 can include a component configured to connect the plurality of storage devices 500 to another device. for example, the plurality of storage devices 500 can be connected to each other or connected to an external device through an interconnect device including a plurality of wires and switching devices. In FIG. 1, a plurality of storage devices 500 connected to one rack 50 is described. However, embodiments of the disclosure may include data infrastructure that include a plurality of racks.

The data center 10 can include a plurality of racks 50 to which a plurality of storage devices 500 are attached, as well as a temperature sensor configured to measure and monitor the internal or ambient temperature of the data center 10, and an air conditioning unit 20 configured to control an air flow inside the data center 10 in order to maintain the ambient temperature in the data center 10 in a temperature range of 10-35° C. For example, the American Society for Refrigeration and Air Conditioning (ASHRAE) suggests that a recommended temperature range of the data center be 18 to 27° C., an allowable temperature range of the data center be 15 to 32° C. (class1) or 10 to 35° C. (class2), and a relative humidity range of the data center be 20 to 80%. The ASHRAE's suggestions might be considered a standard or a reference for a data center 10 to maintain or achieve a level or a range of internal operations. The air conditioning unit 20 can continuously supply air having a temperature and a humidity below a certain level to an area or a space in which the plurality of racks 50, to which a plurality of storage devices 500 are attached, are located. As a result, the air conditioning unit 20 can remove, disperse or discharge heat generated in each of the plurality of storage devices 500 from inside of the data center 10 to an outside of the data center 10. Referring to FIG. 1, the air conditioner 20 may supply cold air through the floor of the data center 30 while removing or sucking hot air delivered through a ceiling or a top of the data center 30. According to an embodiment, the air conditioner 20 can differentially control an air flow based on an internal structure of the data center 10.

Data infrastructure can refer to a digital infrastructure that facilitates data sharing and consumption. Like other infrastructure, data infrastructure can include structures, services, and facilities used for data sharing and consumption. For example, the data infrastructure can include various components or apparatuses including hardware, software, networking, services, policies, and the like that enable data consumption, storage and sharing. The data infrastructure can provide a foundation on which to create, manage, use, and secure data.

For example, the data infrastructure can be divided into a physical infrastructure, an information infrastructure, a business infrastructure, and the like. The physical infrastructure can include data storage devices, data processing devices, input/output networks, data sensor facilities, and the like. The information infrastructure can include data repositories such as business applications, databases, and data warehouses, cloud resources and services including virtualization systems, and virtual services, or the like. Further, the business infrastructure can include business intelligence (BI) systems and analytics tools systems such as big data, artificial intelligence (AI), machine learning (ML), or the like.

Each storage device 500 may include a memory device or a memory system connected through a data communication line or a data communication network to a computing device such as a personal computer or a workstation. For example, the computing device can perform at least one operation in response to a user's request, and temporarily store data used or generated in the process of performing the at least one operation in the storage device 500 or, if necessary, permanently store the data in the storage device 500. When a user performs a task including a lot of computation at a high speed such as an operation or operation related to artificial intelligence (AI), machine learning, big data, etc., the computing device may run out of resources to store data used or generated in the process of performing the task. In order to overcome limitations of the internal resources in the computing device, a plurality of storage devices 500 may be used.

According to an embodiment, each of the plurality of storage devices 500 may be detachably connected to a rack 50. The rack 50 may display information on whether each of the plurality of storage devices 500 is in operation. For example, there may be a lamp or an indicator, located at a position where each of the plurality of storage devices 500 is inserted in the rack 50, that indicates whether each of the plurality of storage devices 500 is operating. When the indicator is green, the corresponding storage device 500 is connected and operating. If the indicator is red, the corresponding storage device 500 is connected is not operational. When the indicator is turned off, the corresponding storage device 500 might not be connected.

Figure 2:
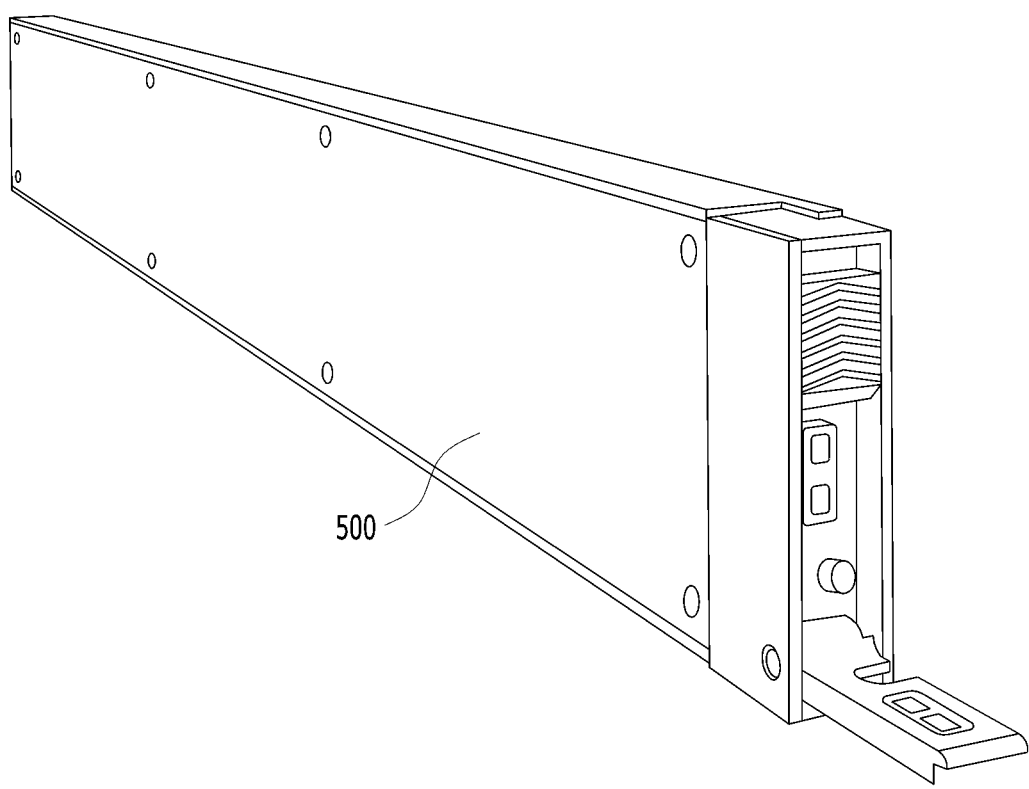
FIG. 2 illustrates a storage included in a data infrastructure shown in FIG. 1.

FIG. 2 illustrates a storage included in a data infrastructure shown in FIG. 1.

Referring to FIG. 2, a storage device 500 can include at least one memory capable of storing data and a case surrounding the at least one memory.

According to an embodiment, the case can include a connection means that can be coupled to the rack 50 described in FIG. 1. For example, the storage device 500 and the rack 50 may be fixed to, or separated from, each other through a bolt, a bracket, a lever, a socket, or the like. In addition, the case can have several functions of protecting the at least one memory device included therein from an impact. Examples of impacts include a physical or electric shock, or water such as moisture. The case may also function in discharging and dispersing heat generated from the inside (e.g., the heat generated by the at least one memory device) to the outside (e.g., the data center 10 shown in FIG. 1).

According to an embodiment, the case can include front, back and side surfaces that have a membrane having a porous material.

According to an embodiment, the at least one memory device may include a memory chip including a plurality of volatile memory cells or a plurality of non-volatile memory cells.

According to an embodiment, the at least one memory device can include a plurality of memory chips. The plurality of memory chips can be disposed, or attached, on a printed circuit board (PCB).

According to an embodiment, the at least one memory device can include a controller for performing a data input/output operation for storing, reading or deleting data in or from the plurality of memory chips.

According to an embodiment, the controller and the plurality of volatile memory cells or the plurality of non-volatile memory cells may be integrated into a single chip.

According to an embodiment, the case may include an indicator light indicating an operating state of the storage device 500. For example, similar to an indicator that may be included in the rack 50, the indicator light can indicate an operating state of the storage device 500 using green light, red light, no light, and the like.

Figure 3:
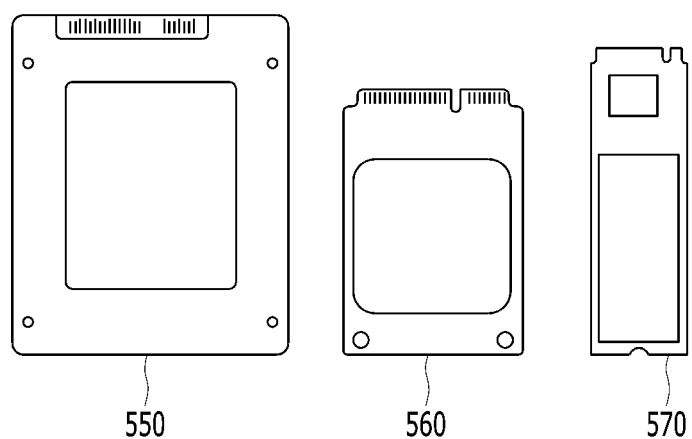
FIG. 3 illustrates a first example of a storage device according to an embodiment of the present disclosure.

FIG. 3 illustrates a first example of a storage device according to an embodiment of the present disclosure.

Referring to FIG. 3, first to third storage devices 550, 560, and 570 can be implemented in various forms. According to embodiments of the disclosure, the first to third storage devices 550, 560, and 570 can have different sizes, shapes, and the like corresponding to a usage purpose, operation performance, or a connection means. For example, the first to third storage devices 550, 560, and 570 can each include a plurality of pins or pads configured to be connected to an external device or an interconnect device. The plurality of pins or pads in the first storage device 550 are exposed but do not protrude. The plurality of pins or pads in the second storage device 560 are not only exposed, but also have a protruding shape. The plurality of pins or pads in the third storage device 570 may be disposed inside the case without being exposed. Because the first to third storage devices 550, 560, and 570 can have different shapes, cases surrounding the first to third storage devices 550, 560, and 570 may have different shapes.

Figure 4:
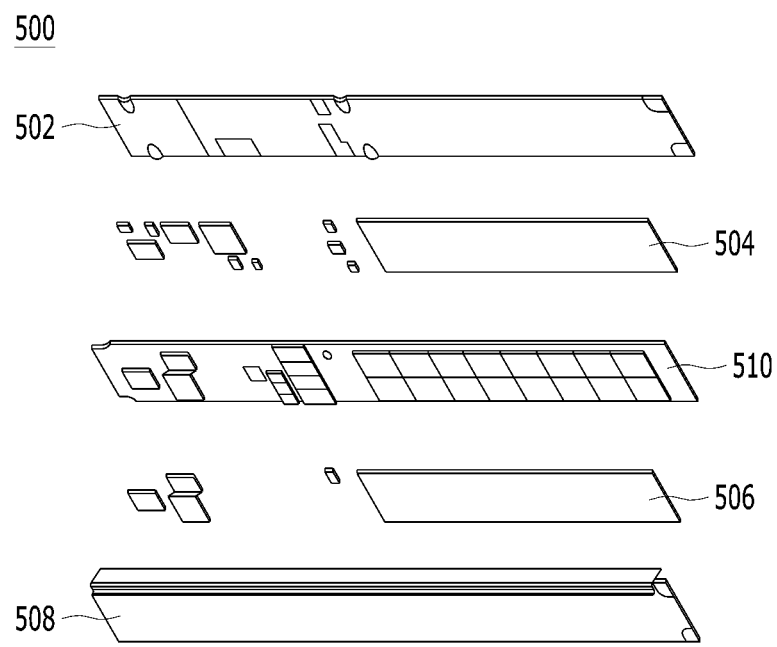
FIG. 4 illustrates a second example of a storage device according to an embodiment of the present disclosure.

FIG. 4 illustrates a second example of a storage device according to an embodiment of the present disclosure.

Referring to FIG. 4, a storage device 500 can include a printed circuit board PCB (510) on which a plurality of semiconductor chips, each including a memory, are attached or arranged. The PCB is formed with at least one wire connecting the plurality of semiconductor chips. An upper case 502 may cover an upper or top portion of the printed circuit board 510, and a lower case 508 may cover a lower or bottom portion of the printed circuit board 510.

According to an embodiment, the memory in the plurality of semiconductor chips disposed on the printed circuit board 510 can include a plurality of volatile memory cells or a plurality of non-volatile memory cells. Further, a semiconductor chip including a controller for controlling data input/output operations, to/from the memory, can be disposed on the printed circuit board 510.

According to an embodiment, the semiconductor chip including a control device for performing data communication between devices can be disposed on the printed circuit board 510.

Heat might be generated while a data input/output operation is performed in a semiconductor chip disposed on the printed circuit board 510. As the number of semiconductor chips disposed on the printed circuit board 510 increases, reducing heat generated from the semiconductor chip or cooling the semiconductor chip may become significant issues to address in order to maintain the performance of the storage device 500. When a surface temperature of a semiconductor chip rises, a device or a component for dissipating heat might be used to lower any elevated surface temperature. For example, the storage device 500 can include a first thermal pad 504 disposed between the printed circuit board 510 and the upper case 502 and a second thermal pad 506 disposed between the printed circuit board 510 and the lower case 508.

Referring to FIG. 4, the first thermal pad 504 and the second thermal pad 506 can cover, or contact, some semiconductor chips that generate a relatively larger amount of heat from among the plurality of semiconductor chips disposed on the printed circuit board 510. The first thermal pad 504 and the second thermal pad 506 can directly contact the surface of the semiconductor chip, or pins or pads of the semiconductor chip, to remove heat through heat conduction. In addition, the first thermal pad 504 and the second thermal pad 506 can transfer the heat to be taken from the semiconductor chip to the upper case 502 and the lower case 508. To this end, the first thermal pad 504 and the second thermal pad 506 can include a material having high thermal conductivity (unit, W/m·K). According to an embodiment, the first thermal pad 504 and the second thermal pad 506 can cover an entire area or surface of the printed circuit board 510.

The first thermal pad 504 and the second thermal pad 506 in the storage device 500 described with reference to FIG. 4 do not perform an essential or critical role in data input/output operations. The first thermal pad 504 and the second thermal pad 506 can play an indirect role in the data input/output operations by discharging heat generated on the printed circuit board 510 and heat generated by the plurality of semiconductor chips to the outside through the upper case 502 and the lower case 508. When the storage device 500 includes the first thermal pad 504 and the second thermal pad 506, a thickness and a weight of the storage device 500 can increase. In addition, the first thermal pad 504 and the second thermal pad 506 can increase a manufacturing cost of the storage device 500.

Figure 5:
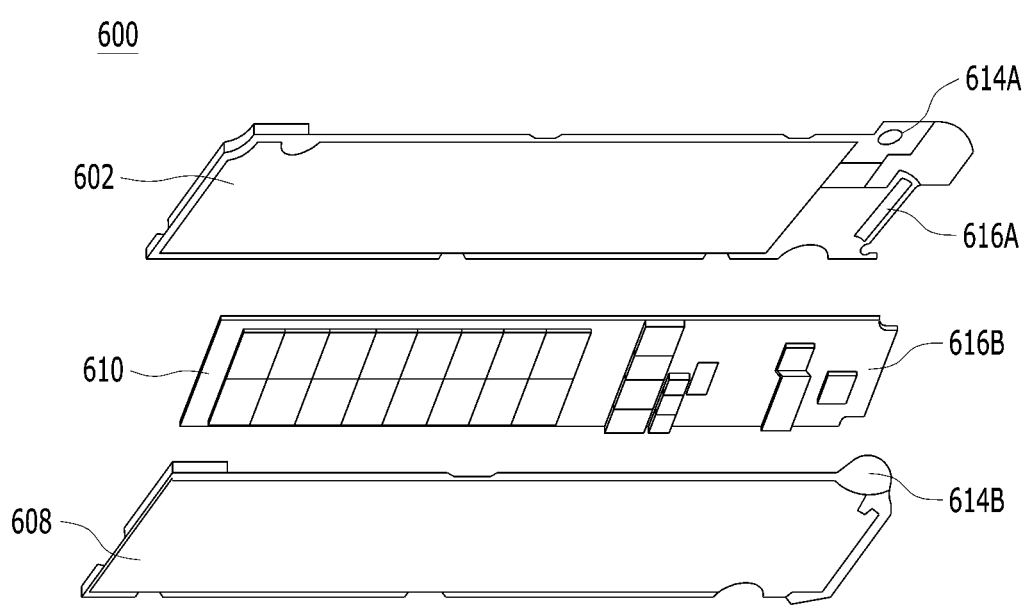
FIG. 5 illustrates a third example of a storage device according to an embodiment of the present disclosure.

FIG. 5 illustrates a third example of a storage device according to an embodiment of the present disclosure.

Referring to FIG. 5, a storage device 600 can include a printed circuit board (PCB) 610 on which a plurality of semiconductor chips having memory elements are attached and in which at least one wire connecting the plurality of semiconductor chips is formed. The storage device 600 may also include a first case 602 covering an upper or top portion of the printed circuit board 610, and a second case 608 covering a lower or bottom portion of the printed circuit board 610.

According to an embodiment, the printed circuit board 610 shown in FIG. 5 can be substantially the same as the printed circuit board 510 shown in FIG. 4. However, unlike the storage device 500 shown in FIG. 4, the storage device 600 shown in FIG. 5 might not include components corresponding to the first thermal pad 504 and the second thermal pad 506.

According to an embodiment, the storage device 600 can include an empty space between the printed circuit board 610 and the first case 602. The storage device 600 can also include, or include in the alternative, an empty space between the printed circuit board 610 and the second case 608. In particular, the plurality of semiconductor chips disposed on the printed circuit board 610 do not directly contact either the first case 602 or the second case 608. Because there is no pad or component for transferring heat between the plurality of semiconductor chips in the storage device 600 and the first case 602 and the second case 608, the weight, thickness, and volume of the storage device 600 is reduced compared to the storage device 500 in FIG. 5. In addition, a manufacturing cost of the storage device 600 can be reduced.

Because there is no pad or component for transferring heat between the plurality of semiconductor chips in the storage device 600 and the first case 602 and the second case 608, the first case 602 and the second case 608 can be made of a breathable material to disperse heat generated from the plurality of semiconductor chips. Through the breathable material, the first case 602 and the second case 608 may disperse heat generated from the inside of the storage device 600 to the outside through an air flow between the inside and the outside of the first and second cases 602 and 608. In addition, the first case 602 and the second case 608 can protect the printed circuit board 610 and the plurality of semiconductor chips disposed on the printed circuit board 610 from external impact/shock or from water that infiltrates the storage device 600 from the outside.

According to an embodiment, the printed circuit board 610 includes a protrusion region 616B, which includes at least one pin or pad for connection with a socket of an external device (e.g., a rack 50, a board, etc.). A breathable case, including the first case 602 and the second case 608, can include an opening 616A for exposing the protruding region 616B. The opening 616A shown in FIG. 5 is included in the first case 602, but in another embodiment, an opening can be included in the second case 608. The breathable case can include an internal vacant space arranged for the printed circuit board 610 between the first case 602 and the second case 608. The printed circuit board 610 can be fixed in the internal vacant space of the breathable case by a fasten means such as a screw installed at an edge region. Referring to FIG. 5, a shape of the printed circuit board 610 included in the storage device 600 can be variously modified. The breathable case including the first case 602 and the second case 608 may have a structure corresponding to the shape of the printed circuit board 610.

According to an embodiment, connection or separation of the first case 602 and the second case 608 may be made through fastening structures 614A, 614B using a screw, a snap-fit, or the like. When the plurality of semiconductor chips disposed on the printed circuit board 610 do not operate, the first case 602 and the second case 608 can be separated for replacement of a printed circuit board on which a plurality of operating semiconductor chips is disposed.

Figure 6:
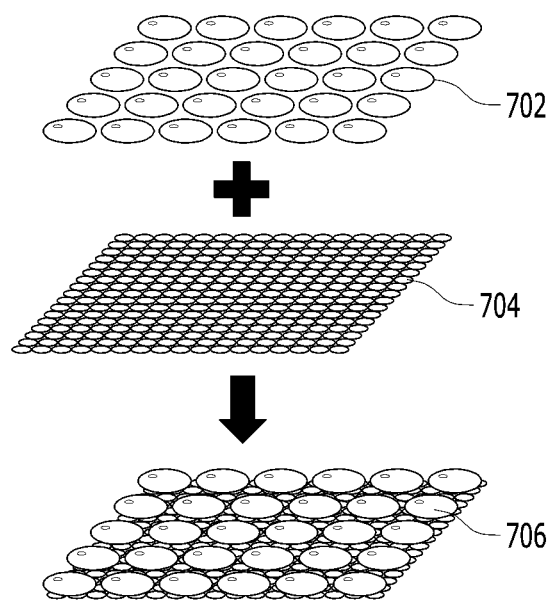
FIG. 6 illustrates a detail of a case shown in FIG. 5.

FIG. 6 illustrates a detail of a case shown in FIG. 5.

Referring to FIG. 6, the first case 602 and the second case 608, which are breathable cases, can each include a plurality of layers 706. For example, the plurality of layers 706 include a first layer 702 including a polyurethane membrane and a second layer 704 including a graphite-fabric membrane. According to an embodiment, the plurality of layers 706 can be composed only of a first layer 702 and a second layer 704. According to an embodiment, a second layer 704 can include a graphene-fabric membrane instead of a graphite-fabric membrane. Further, a second layer 704 can include a carbon fiber, an aramid fabric, or a glass fabric.

Both the first layer 702 and the second layer 704 can be configured as a membrane. A membrane selectively passes specific components or elements, so for example the first layer 702 and the second layer 704 can block water without blocking air flow. The first layer 702 can have larger pores than the second layer 704. For example, a pore formed in the first layer 702 can be formed to be about 50 to 150 microns (μm) in diameter, and a diameter of a pore formed in the second layer 704 can be formed to be about 50 microns (μm) or less. Further, a difference in pores between the first layer 702 and the second layer 704 may enhance the Bernoulli effect, namely, when air flows or moves from a wide area to a narrow area, the speed of the air flow increases while the air pressure decreases. Accordingly, a difference between the pores of the first layer 702 and the second layer 704 can accelerate an air flow inside and outside of the first case 602 and the second case 608 as air flows from a larger diameter pore through a smaller diameter pore. Air flowing over the printed circuit board 610 can cool surfaces of semiconductor chips through convection heat transfer.

The first case 602 and the second case 608 may disperse or discharge heat generated by a semiconductor chip from the inside to the outside. The second layer 704 may be an inner layer located inside the storage device 600 and closer to the printed circuit board 610 on which a plurality of semiconductor chips emitting heat is disposed. The first layer 702 can be disposed as an outer layer on the second layer 704 and further from the printed circuit board 610. The second layer 704 including a graphite-fabric membrane can have a higher thermal conductivity (unit, W/m·K) than the first layer 702 including a polyurethane membrane. Further, the second layer 704 can have a higher thermal flash point (unit, °C.) than the first layer 702.

For example, the thermal conductivity of the second layer 704 including the graphite-fabric membrane may be higher than that of elemental aluminum. The thermal conductivity of aluminum is up to 204 W/m·K. The thermal conductivity of the second layer 704 can be higher than that of aluminum. For example, the thermal conductivity of the second layer 704 can be up to 470 W/m·K.

In addition, regarding the second layer 704, the higher the thermal flash point to prevent fire, the higher the safety of the storage device 600. Typically, a surface temperature of a semiconductor chip including a memory, a controller, and the like can rise to 80° C. to 90° C. In a harsh environment, the surface temperature of the semiconductor chip can rise to 100° C. to 120° C. Accordingly, in an embodiment, the second layer 704, which is closer to the plurality of semiconductor chips, can be configured to have a thermal ignition point in a range of 150° C. to 600° C.

According to an embodiment, the first layer 702 can have a lower thermal conductivity and a lower thermal ignition point than the second layer 704. The first layer 702, however, can have a higher impact strength (unit, kJ/m², kgf cm/cm²) than the second layer 704 for protecting the printed circuit board 610 and semiconductor chips from external impact. Further, the first layer 702 can have superior waterproofing performance compared with the second layer 704. The first case 602 and the second case 608, which respectively cover the upper/top and lower/bottom portions of the printed circuit board 610 in the storage device 600, can block water intrusion from the outside.

According to an embodiment, both the first layer 702 and the second layer 704 can be formed of a hydrophobic material rather than a hydrophilic material. For example, the printed circuit board 610 in the storage device 600 does not discharge or generate water or moisture. Therefore, unlike the fabric used in clothing that absorbs and discharges sweat, the first case 602 and the second case 608 covering the upper/top and lower/bottom portions of the printed circuit board 610 might not absorb water and moisture.

Like the data infrastructure described in FIG. 1, a system, an apparatus, or a data center including a plurality of storage devices 500, 600 arranged through the rack 50 can include an air conditioner to dissipate heat generated from the plurality of storage devices 500 or 600. For example, in a case of a storage device including a non-volatile memory cell, deterioration in input/output operation performance can be avoided when a surface temperature of the semiconductor chip is maintained at a level of 70° C. or less. Accordingly, when the surface temperature rises to 80° C. to 100° C. due to internal heat generation of the plurality of semiconductor chips, the breathable case including the first case 602 and the second case 608 composed of the first layer 702 and the second layer 704 can maintain the surface temperature of the semiconductor chip below 70° C. through the air flow between the inside of the storage device and the outside of the storage device.

Figure 7:
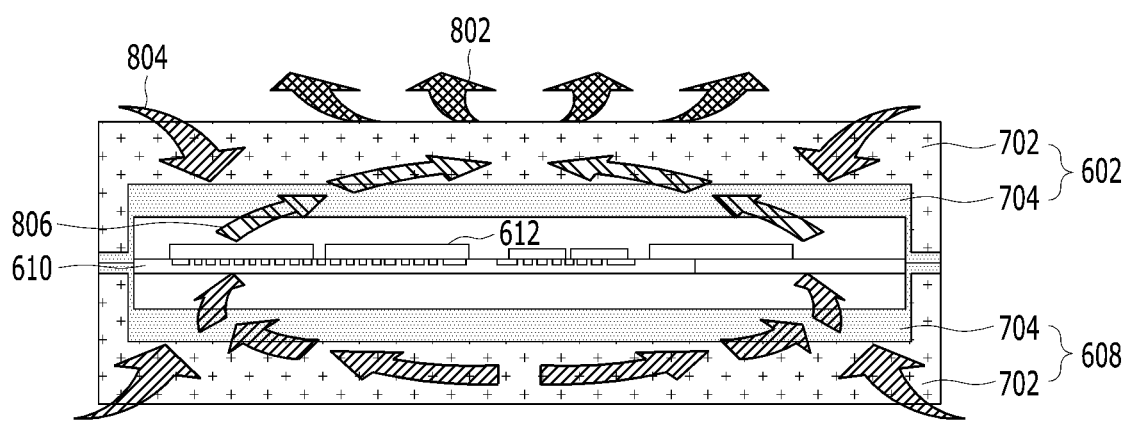
FIG. 7 illustrates a cross section of a storage device shown in FIG. 5.

FIG. 7 illustrates a cross section of a storage device shown in FIG. 5.

Referring to FIG. 7, a plurality of semiconductor chips 612 may be attached to a printed circuit board PCB 610 and at least one wire connecting a plurality of semiconductor chips 612 may be formed in the printed circuit board PCB 610. The plurality of semiconductor chips 612 can emit heat, resulting in heated air 806, while performing data input/output operations or the like. Each of a first case 602 and a second case 608 covering the upper/top and lower/bottom portions, respectively, of the printed circuit board 610 can include a first layer 702 and a second layer 704 described with reference to FIG. 6. The first case 602 and the second case 608 can disperse or discharge heated air 806 generated by the plurality of semiconductor chips 612 to the outside as air flow 802, while incoming air 804 is introduced from the outside into the storage device. The air flow 802 dispersed or discharged from the upper case 602 and the lower case 608 to the outside can have the same or higher temperature than the heated air that results from heat 806 emitted by the semiconductor chip 612.

Referring to FIGS. 5 to 7, the storage device 600 can transfer or emit heat between the plurality of semiconductor chips 612 emitting heat and the breathable case including the first case 602 and the second case 608. The storage device 600 does not include any component corresponding to the thermal pads 504 or 506 shown in FIG. 4 in order to dissipate the internal heat to the exterior of the storage device. An empty space exists between the plurality of semiconductor chips 612 and the first case 602 or the second case 608 to allow air to flow, and the heated air 806 generated by the plurality of semiconductor chips 612 can flow through the first case 602 and the second case 608 into the outside. Accordingly, heat can be diffused or emitted through the air flow 802 through the breathable case including the first case 602 and the second case 608. For example, the storage device 600 can be used in a place or a facility such as a data center in which an air conditioner capable of continuously supplying air below a certain temperature is installed.

As above described, a storage device according to an embodiment of the present invention can avoid performance degradation and reduce a size or a volume of the storage device by dispersing heat generated during data input/output operations performed within the storage device.

Further, according to an embodiment, the data infrastructure according to an embodiment of the present invention can efficiently control an internal temperature through an air conditioning system in the data infrastructure including a plurality of storage devices.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A storage device, comprising:
   a printed circuit board (PCB) with attached semiconductor chips, each including a memory, and with at least one wire coupling the semiconductor chips; and
   a breathable case surrounding a top portion and a bottom portion of the printed circuit board and comprising a first layer disposed on a second layer, which is exposed to the printed circuit board, wherein the second layer has smaller pores than the first layer.

2. The storage device according to claim 1, wherein the first layer comprises at least one of a poly-urethane membrane layer or a graphene layer, and the second layer comprises at least one of graphite-fabric membrane layer, a carbon fabric layer, an aramid fabric layer, or a glass fabric layer.

3. The storage device according to claim 1, wherein the breathable case is divided into
   a first part, comprising a first layer and a second layer, configured to cover the top portion of the printed circuit board; and
   a second part, comprising a first layer and a second layer, configured to cover the bottom portion of the printed circuit board,
   wherein the first part and the second part can be detached from each other.

4. The storage device according to claim 1, wherein the printed circuit board comprises a protrusion portion including at least one pin configured to be coupled to a socket of an external apparatus, and
   wherein the breathable case comprises an opening configured to expose the protrusion portion to an outside.

5. The storage device according to claim 1, wherein the semiconductor chips attached on the printed circuit board are not in contact with the breathable case.

6. The storage device according to claim 5, wherein an air gap is arranged between the semiconductor chips and the breathable case.

7. The storage device according to claim 1, wherein the first layer comprises a hydrophobic material and has a porous membrane structure, and the second layer comprises a fabric material and has a porous membrane structure.

8. The storage device according to claim 1, wherein the second layer has a greater thermal conductivity than elemental aluminum.

9. The storage device according to claim 8, wherein a surface of the semiconductor chips is cooled by air flowing from an inside of the breathable case to an outside of the breathable case.

10. The storage device according to claim 1, wherein a thermal flash point of the first layer and the second layer is 100° C. or higher.

11. A data infrastructure, comprising:
    a plurality of storage devices, each storage device comprising a breathable case that surrounds a top portion and a bottom portion of a printed circuit board on which a plurality of semiconductor chips is attached and that comprises a first layer exposed to an outside and a second layer exposed to the printed circuit board, wherein the second layer has smaller pores than the first layer; and
    a rack configured to arrange the plurality of storage devices in a row direction, a column direction, or a row and column direction.

12. The data infrastructure according to claim 11, further comprising:
    a temperature sensor configured to measure and monitor an internal temperature of the data infrastructure; and
    an air conditioning unit configured to control an air flow to maintain the internal temperature in a range of 10° C. to 35° C. (Celsius).

13. The data infrastructure according to claim 11, wherein the first layer comprises at least one of a poly-urethane membrane layer or a graphene layer, and the second layer comprises at least one of graphite-fabric membrane layer, a carbon fabric layer, an aramid fabric layer, or a glass fabric layer.

14. The data infrastructure according to claim 11, wherein the breathable case is divided into
    a first part, comprising a first layer and a second layer, configured to cover the top portion of the printed circuit board; and
    a second part, comprising a first layer and a second layer, configured to cover the bottom portion of the printed circuit board,
    wherein the first part and the second part are detachable from each other.

15. The data infrastructure according to claim 11, wherein the rack comprises a plurality of sockets,
    wherein the printed circuit board comprises a protrusion portion including at least one pin configured to be coupled to one of the plurality of sockets in the rack, and
    wherein the breathable case comprises an opening configured to expose the protrusion portion to the outside.

16. The data infrastructure according to claim 11, wherein the plurality of semiconductor chips attached on the printed circuit board are not in contact with the breathable case.

17. The data infrastructure according to claim 16, wherein the plurality of semiconductor chips is separated from the breathable case by an air gap.

18. The data infrastructure according to claim 11, wherein the first layer comprises a hydrophobic material and has a porous membrane structure, and the second layer comprises a fabric material and has a porous membrane structure.

19. The storage device according to claim 9, wherein the surface of the semiconductor chips is cooled below 70° C.

20. The data infrastructure according to claim 19, wherein the surface of the semiconductor chips is cooled below 70° C. when the surface temperature rises above 80° C.

* * * * *